United States Patent [19]
Xu

[11] Patent Number: 5,340,641
[45] Date of Patent: Aug. 23, 1994

[54] ELECTRICAL OVERSTRESS PULSE PROTECTION

[76] Inventor: Antai Xu, 750 W. Ventura Blvd., Camarillo, Calif. 93010

[21] Appl. No.: 11,859

[22] Filed: Feb. 1, 1993

[51] Int. Cl.⁵ .................................................. B32B 9/00
[52] U.S. Cl. .................................. 428/209; 428/901; 338/21
[58] Field of Search ................. 428/209; 201/72; 338/21

[56] References Cited

U.S. PATENT DOCUMENTS

| | | | |
|---|---|---|---|
| 2,273,704 | 2/1942 | Grisdale | 201/72 |
| 2,993,815 | 7/1961 | Treptow | 428/209 |
| 3,210,214 | 10/1965 | Smith | 428/209 |
| 3,864,658 | 2/1975 | Pitha et al. | 338/21 |
| 5,011,732 | 4/1991 | Takeuchi et al. | 428/209 |
| 5,068,634 | 11/1991 | Shrier | 338/21 |

Primary Examiner—Patrick J. Ryan
Assistant Examiner—Cathy Lee

[57] ABSTRACT

An electrical overstress responsive composite is formed on an electrically insulative substrate, has a pair of electrodes associated with the substrate and defining a gap between the electrodes and over the interposed portion of the substrate, a pattern of closely spaced electrically conductive elements span said gap and are affixed to said substrate, and a dielectric resin overlies said conductive elements and also spans said gap. The dielectric resin may include conductive and/or semiconductive fine particles. The composite presents a high resistance to a low voltage applied across said electrodes and a low resistance to a high voltage applied across said electrodes.

20 Claims, 2 Drawing Sheets

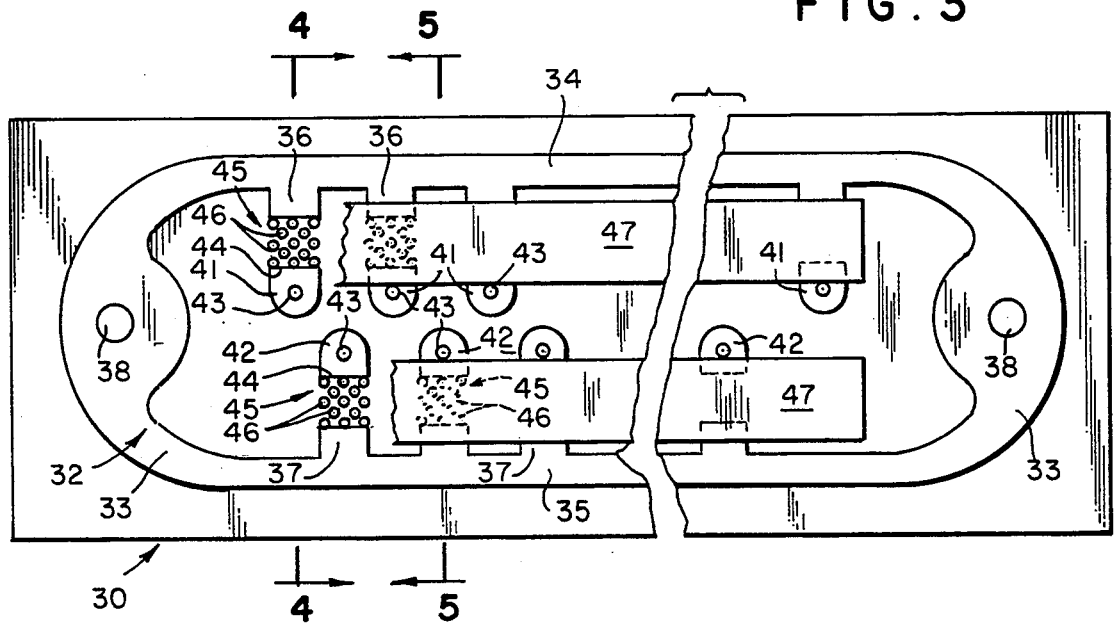
FIG. 3
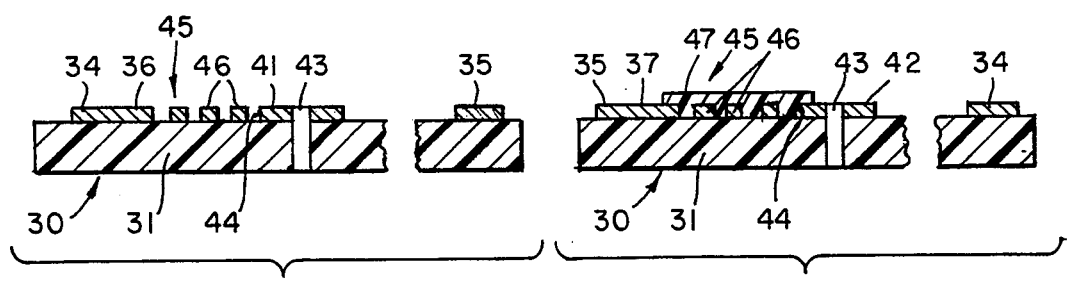
FIG. 4
FIG. 5
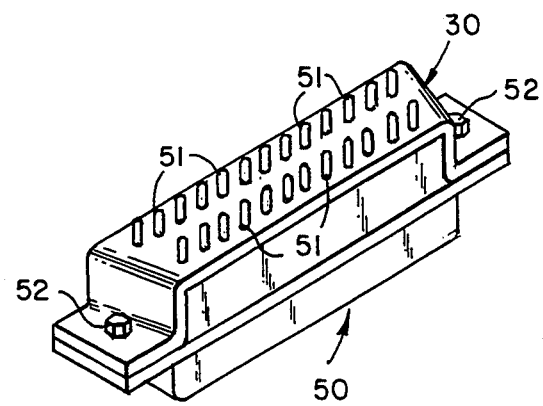
FIG. 6

ELECTRICAL OVERSTRESS PULSE PROTECTION

BACKGROUND AND SUMMARY OF THE INVENTION

The present invention relates to the protection of electrical and electronic circuits from high energy electrical overstress pulses or surges that might be injurious or destructive to the circuits, and render them non-functional, either permanently or temporarily. Suitable non-linear compositions and formulations of materials are known which can be connected to, or incorporated as part of an electrical circuit, and are characterized by high electrical resistance when exposed to low or normal operating voltages, but essentially instantaneously switch to low electrical resistance in response to an excessive or overstress voltage pulse, thereby shunting the excessive voltage or overstress pulse to ground. Structural arrangements are also known to facilitate the incorporation of such compositions into components of the circuit to be protected. The present invention relates particularly to a composite of composition and structure which combine to provide the overstress responsive environment.

The composite utilized in practicing the present invention is designed to respond substantially instantaneously to the leading edge of an overstress voltage pulse to change its electrical characteristics, and by shunting the pulse to ground, to thereby reduce the transmitted voltage of the pulse to a much lower value, and to clamp the voltage at that lower value for the duration of the pulse. This composite is also capable of substantially instantaneous recovery to its original high resistance value on termination of the overstress pulse, and of repeated responses to repetitive overstress pulses. For example, those composite can be designed to provide an ohmic resistance in the megohm range in the presence of low applied voltages in the range of 10 to more than 100 volts. However, upon the application of a sudden overstress pulse of, for example, 15,000 volts, this composite essentially instantaneously drops in resistance and switches to a low impedance shunt state that can reduce the overstress pulse to a value in the range of about a hundred volts, or less, and clamps the voltage at that low value for the duration of the pulse. In the present description, the high resistance state is called the "off-state", and the low resistance condition under overstress is called the "on-state".

Overstress responsive compositions and structures to facilitate the use of those compositions are known in the art. In general, those compositions constitute a mixture of finely divided electrically conductive and semiconductive particles supported in fixed spaced relation to each other in an electrically insulative resin binder or matrix. The most effective overstress composition is of the type described in U.S. Pat. No. 4,992,333 to Hyatt. In general, said composite comprises a distribution of different sized particles of conductive and semiconductive materials ranging from submicron to tens or a few hundreds of microns, with angstrom sized spacer particles, which are densely packed and bound with an insulative resin matrix. Other electrical overstress compositions are described and illustrated in other prior art patents.

U.S. Pat. No. 2,273,704 to R. O. Grisdale discloses a granular material having a non-linear voltage-current characteristic. This patent discloses a mixture of conductive and semiconductive granules that are coated with a thin insulative film (such as metal oxides), and are compressed and bonded together in a matrix to provide stable, intimate and permanent contact between the granules.

U.S. Pat. No. 4,097,834 to K. M. Mar et al. provides an electronic circuit protective device in the form of a thin film non-linear resistor, comprising conductive particles surrounded by a dielectric material, and coated onto a semiconductor substrate.

U.S. Pat. No. 2,796,505 to C. V. Bocciarelli discloses a non-linear precision voltage regulating element comprised of conductive particles having insulative oxide coatings thereon that are bound in a matrix. The particles are irregular in shape, and are point contiguous, i.e. the particles make point contact with each other.

U.S. Pat. No. 4,726,991 to Hyatt et al. discloses an electrical overstress protection material, comprised of a mixture of conductive and semiconductive particles, all of whose surfaces are coated with an insulative oxide film, and which are bound together in an insulative matrix, wherein the coated particles are in contact, preferably point contact, with each other.

U.S. patent application Ser. No. 07/666,026 to Stephenson and assigned to the assignee of the present invention, discloses a structural arrangement for the inclusion of these non-linear materials into electrical circuits.

Additional patents illustrative of the prior art in respect to this general type of non-linear resistor are U.S. Pat. Nos. 2,150,167 to Hutchins et al., 2,206,792 to Stalhana, 3,864,658 to Pitha et al., and 4,977,357 and 5,068,634 to Shrier.

As illustrated in the foregoing prior art, the overstress responsive compositions are usually positioned as a bulk material between a pair of contraposed electrodes, one of which is a signal electrode and the other is a ground electrode or a ground plane. The present invention, likewise functions to place a non-linear overstress responsive composite in a gap between a signal electrode and a ground electrode or ground plane. However, in the present invention, the composite is a hybrid of structural elements and composition. The key feature of the present invention resides in the use of a matrix or pattern of closely spaced electrically conductive metallic elements fixed on an electrically insulating substrate. These elements can conveniently be applied through screen printing, etching, vapor deposition, and the like, in a manner similar to the production of printed circuits. Preferably, the metallic elements are closely spaced and occur in a regular pattern, such as a uniform dot matrix, or a succession of closely spaced parallel lines or bars. For example, the spacing between the metallic elements may be from about 0.5 to about 200 microns depending on other factors to be described subsequently.

In addition to the pattern of closely spaced conductive elements, a coating composition is applied over the pattern covering and spanning the gap between the electrodes. The coating includes an insulative or dielectric resin whose dielectric strength is usually adjusted by the fill-ratio of insulative particles in a size range preferably of about 0.01 to about 50 microns. This coating may also include fine particulates of conductive and/or semiconductive materials. The resin (including any insulative fill particulate) may be present in an amount of from about 15 to 100% by volume of the coating. The conductive powder particles may range from 0 to about 60% by volume of the coating and have a particle size between about 0.01 and about 100 microns. The semiconductive powder particles may also range from 0 to about 60% by volume of the coating with particle sizes ranging between about 0.01 and about 50 microns. In such a composite of metallic elements and an overlying resin coating, with or without a particulate inclusion, the metallic elements function in a manner similar to conductive particles distributed in the resin matrix. However, in the present invention, these conductive metallic elements are arranged in a precisely controlled pattern, spatial distribution and spacing between conductive elements. The spacing of these elements can vary depending on the particulate inclusion in the resin, and the overstress electrical response properties desired for the composite.

The dielectric resin of the coating composition may preferably be a dielectric epoxy, silicone, or other resin, filled with insulative or pigment fillers, having suitable resistive or dielectric, mechanical and processing properties for the specific environment or application and production of the invention. It is preferred that the resin resistivity be from about $10^{12}$ to about $10^{15}$ ohms-meter. One suitable resin for the practice of the present invention is a silicone rubber marketed by General Electric Company as RTV-12, cured by heating.

If a conductive powder or particulate is to be included in the resin coating, it may be selected from a wide range of materials such as powders of carbon black, graphite, copper, aluminum, molybdenum, silver, gold, zinc, brass, cadmium, bronze, iron, tin, beryllium, lead, nickel, stainless steel, tantalum, titanium, tungsten and zirconium, the silicides of titanium, zirconium, hafnium, vanadium, niobium, tantalum, chromium, molybdenum, iron and cobalt, and the borides, nitrides, aluminides and phosphides of the preceding elements which have resistivities of less than a few hundred ohm-cm. Preferably these conductive particles should be free of insulative or high resistance surface oxides, or the like.

If a semiconductor powder is to be included in the resin coating, it may be selected from a wide range of materials, such as silicon carbide, zinc oxide, bismuth oxide, other oxides such as oxides of calcium, niobium, vanadium, iron and titanium, the carbides of beryllium, boron and vanadium, the sulfides of lead, cadmium, zinc, and silver, indium antimonide, silicon, selenium, lead telluride, boron, tellurium, and germanium.

The invention is adaptable for application to various circuit components, interface connection devices, electronics packaging and may also be applied to a printed circuit. In the ensuing specific embodiments of the invention, it is illustrated as applied to a printed circuit and to a connector. While these applications are particularly useful modes for the invention, it is understood that they are presented simply for purposes of illustration, and the invention obviously is not limited thereto.

It is accordingly one object of the present invention to provide for the shunting to ground selectively high voltage overstress pulses or surges.

Another object of the present invention is to provide for the shunting to ground of high voltage overstress pulses or surges, by means of a composite interposed between a signal line and ground.

A further object of the present invention is to provide for such a composite which presents a very high resistance to ground in response to a normal or low voltage on the signal line, and a low resistance to ground in response to a high overstress voltage pulse on said signal line.

Still another object of the present invention is to provide for such a composite which includes an array of conductive elements located between an electrode associated with said signal line and an electrode connected to ground, and arranged in a predetermined and fixed pattern on an electrically insulating substrate, and further includes an electrically insulating resin coating overlying said elements and substrate.

And another object of the present invention is to provide such a composite wherein said electrically insulating resin coating includes conductive and/or semiconductive powder particles distributed therein.

Other objects and advantages of the present invention will become apparent to those skilled in the art from a consideration of the illustrative specific embodiments of the invention provided in the following description, had in conjunction with the accompanying drawings in which like reference characters refer to like or corresponding parts.

DESCRIPTION OF DRAWINGS

FIG. 3 illustrates the invention applied to an overlay or insert for application to a connector;

FIG. 4 is a cross section of FIG. 3 taken along the line 4—4;

FIG. 5 is a cross section of FIG. 3 taken along the line 5—5; and

FIG. 6 shows the overlay or insert of FIG. 3 applied to a connector.

DETAILED DESCRIPTION

Figure 1:
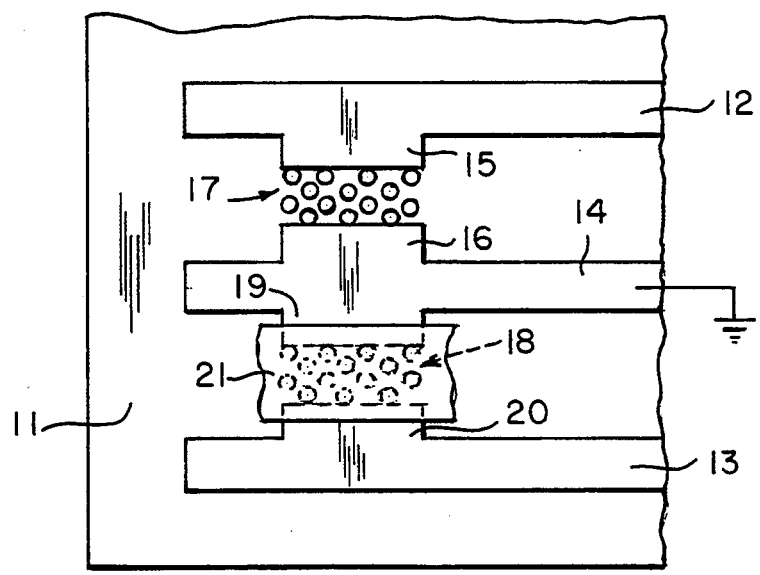
FIG. 1 is an enlarged fragmentary view of a printed circuit board incorporating and illustrating one embodiment of the invention.
Figure 2:
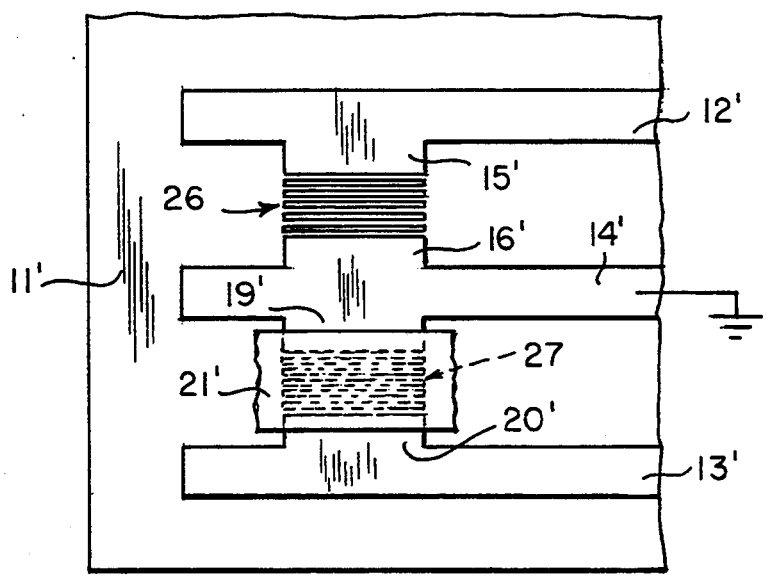
FIG. 2 is an enlarged fragmentary view of a printed circuit board incorporating and illustrating a second embodiment of the present invention.

FIGS. 1 and 2 are enlarged fragmentary views of a printed circuit board embodying two forms of the invention. In both figures, an insulating substrate or circuit board 11 carries three printed circuit leads. The term "printed circuit" is used herein in its generic sense to include not only circuits that are printed, as by screen printing, for example, but also includes the formation of circuits by etching, vapor deposition, etc.

Referring to FIG. 1, leads 12 and 13 are signal leads, one on each side of grounded lead 14. Lead 12 is printed with a projecting electrode 15 in contraposed relation to a corresponding electrode 16 formed on the ground lead 14. A printed matrix of dots 17 is formed of conductive material, and the pattern of dots spans the gap between the facing edges of the electrodes 15 and 16. The array of dots 17 are closely spaced, and this spacing may be in the micron range, preferable from a few microns to a few tens of microns. The dots are formed of conductive material, and are preferably formed on the substrate 11 at the same time as the rest of the printed circuit with the same conductive materials. Accordingly, they may be a metal or a metallic filled resin, or the like.

In FIG. 1, the array of dots 17 is shown uncoated for purposes of illustrating the invention. The same dot pattern 18 is applied across the gap between the electrodes 19 and 20 of signal lead 13 and ground lead 14, but in this instance the dot array and edges of the electrodes are shown covered with a dielectric resin coating 21, which may be a prefilled resin. In practice, the dot array 17 would likewise be coated with the resin. The combination of the dot array and resin coating constitutes the overstress responsive composite of the present invention. This resin coating may, if desired, include powdered conductive and/or semiconductive particles. As is understood in the art, the amount and nature of these inclusions depends upon the spacing between the electrodes, the spacing between the dots, and the electrical properties desired of the composite, such as its low voltage resistance, its high voltage resistance, its response time to an overstress pulse, and the clamping voltage for the overstress pulse.

A similar structure is illustrated in FIG. 2, and like or corresponding parts are similarly numbered, with a prime added to the numerals. The significant difference between the embodiment of FIG. 1 and that of FIG. 2 is the use of an array of parallel conductive bars or lines in FIG. 2 in place of the matrix of dots in FIG. 1. Spanning the gap between the facing edges of electrodes 15' and 16', is a set of parallel closely spaced conductive lines 26. To complete the overstress responsive composite, this array of conductive lines is coated with the dielectric resin 21', as shown applied over the array of conductive lines 27 extending between and over the facing edges of electrodes 19' and 20'. Again, as in the preceding embodiment, the conductive lines 26 and 27 may be printed at the same time as the rest of the circuit, preferably with a spacing between lines of a few microns, and the resin coating may contain conductive and/or semiconductive powders as required to tailor the electrical properties of the overstress composite to the desired values.

In the preferred practice of the invention, the array of conductive elements in the overstress composite array are arranged in a regular or uniform pattern and are equally spaced apart. In the matrix of dots, the elements are all placed on equidistant centers and in a uniform pattern across the gap between the electrodes. Likewise, in the arrangement of parallel lines of conductors, they, too, are all equally spaced from one another, and they are all in a parallel orientation.

As stated earlier, another preferred application of the overstress responsive composite is on, or in a connector. Accordingly, such an embodiment of the invention is illustrated in FIGS. 3–6. In this instance, a separate overstress responsive device is constructed on a separate support or substrate, and the unit is then applied over the pins of a standard connector.

The separate overstress responsive unit 30 is illustrated in FIGS. 3–5, and is shown applied over the pins of a male connector in FIG. 6. The separate unit comprises a base 31, which in this case is a flexible electrically insulating substrate, such as Mylar, Kapton or other material suitable for carrying printed circuits. The structure of the overstress responsive composite is applied on the surface of this substrate by any suitable printed circuit technique, but preferably by applying a metal coating of copper over the substrate surface and etching the surface to form the conductive elements. Standard photoetching and/or lithographic techniques can be employed.

Formed on the base or substrate 31 is a conductive ground plane 32 having end tabs 33 and two side strips 34 and 35 extending between the end tabs. Ground electrodes are formed extending inwardly from each side strip, electrodes 36 from strip 34, and electrodes 37 from strip 35. This ground plane 32 and the substrate 31 have registered holes at 38 in each end tab adapted to receive mounting and grounding screws, or the like, as will be shown subsequently.

A series of conductive pads are formed and located along and spaced from the electrodes of each ground plane side strip, pads 41 along strip 34, and pads 42 along strip 35. Each pad is formed with an opening 43 coincident with a corresponding opening in the substrate 31 for receiving the pins of the connector on which the unit will be mounted, so that the pads make electrical contact with the respective connector pins. In addition, each pin contact pad 41, 42 is formed with an electrode edge 44 contraposed and spaced from the facing edge of a corresponding ground plane electrode 36 or 37. In the gap 45 between each contraposed pair of pin contacts and ground strip electrodes, is a set of conductive dot elements 46 arranged in a regular, closely spaced pattern. In place of the conductive dot pattern, one may substitute a conductive line or bar pattern, such as shown in FIG. 2.

All of the foregoing conductive elements, i.e. the ground plane 32, the pin contact pads 42, the conductive dot patterns 46 and their related ground plane and pad electrodes 36, 37 and 44 are metallic elements applied to the insulative substrate 31, and may all be applied at the same time by whatever circuit printing technique is chosen. After this conductive structure is completed, a dielectric resin coating 47 is applied over the gaps 45, the dot patterns 46, and portions of the electrode pairs 36, 44 and 37, 44. As stated above, this dielectric resin may contain powdered conductor and/or semiconductor particles to tailor the electrical properties in the gaps 45 as desired. The resin coating 41, of course, covers all the gaps 45 in the unit, but is shown broken away to leave exposed two end gaps 45 for illustrative clarity.

In FIG. 6, the overstress responsive unit 30 is shown applied over the pins 51 of connector 50. The upper face of the overstress unit 30 as shown in FIG. 3, is faced downwardly on the connector, and the connector pins 51 are received in the holes 43 in the respective pin contact pads 41, making electrical contact between each pin and its respective pad. The ends of the flexible unit 30 are bent down to conform to the exterior contour of the connector, and the connector mounting screws 52 secure the unit 30 to the housing, thereby making a secure electrical ground connection between the ground plane end tabs 33 and the connector housing.

In use, if a high voltage overstress pulse, surge or transient appears on any pin of the connector, that pulse causes the normally high impedance overstress responsive composite associated with the pad of that pin to switch instantaneously to a low impedance state, thereby shunting the pulse to ground and clamping the voltage on the pin to a low value for the duration of the pulse. Upon termination of the overstress pulse, the impedance of the composite reverts to its high impedance state, and remains in that condition until another overstress pulse appears.

From the foregoing illustrative specific embodiments of the invention, it will be apparent that there is provided an overstress responsive composite comprising a predetermined pattern of conductive elements fixedly positioned on an insulative substrate, in combination with a resin dielectric matrix cooperating with said pattern of conductive elements to provide a desired electrical response to an overstress pulse. The separate application of conductive elements in a predetermined pattern on an insulating substrate, replaces the prior art approach of mixing the conductive elements as particulates in the dielectric resin, and provides a more controlled reproducible and predetermined electrical response to overstress pulses. Various modifications and alternative structures will be apparent to those skilled in the art. Such modifications and alternatives as are embraced by the spirit and scope of the appended claims are contemplated as being within the purview of the present invention.

What is claimed is:

1. An overstress responsive composite comprising an electrically insulative substrate, a pair of contraposed electrodes defining a gap therebetween over a portion of the surface of said substrate, a pattern of closely spaced electrically conductive elements affixed to said substrate and spanning said gap, and a continuous dielectric overlay also spanning said gap, said composite presenting a high resistance to a low voltage applied across said gap and a low resistance to a high voltage applied across said gap.

2. A composite as set forth in claim 1, wherein said overlay is a resin.

3. A composite as set forth in claim 2, wherein said resin includes particulates selected from the group consisting of electrically conductive, semiconductive and insulative powders.

4. A composite as set forth in claim 1, wherein said continuous overlay comprises from about 15 to 100% by volume of resin, from 0 to about 60% by volume of conductor powder in the particle size range of from about 0.01 to about 100 microns, and from 0 to about 60% by volume of semiconductor powder in the particle size range of from about 0.01 to about 50 microns.

5. A composite as set forth in claim 1, wherein said electrically conductive elements are in the form of spaced dots.

6. A composite as set forth in claim 5, wherein said dots are arranged in a regular pattern and the spacing between said dots is between about 0.5 and about 200 microns.

7. A composite as set forth in claim 6, wherein said spacing between dots is substantially uniform and is a value selected from between about 0.5 and about 200 microns.

8. A composite as set forth in claim 1, wherein said electrically conductive elements are in the form of substantially parallel spaced lines or bars.

9. A composite as set forth in claim 8, wherein said lines or bars are spaced apart between about 0.5 and about 200 microns.

10. A composite as set forth in claim 9, wherein the spacing between lines or bars is substantially uniform and is a value selected from between about 0.5 and about 200 microns.

11. A composite as set forth in claim 1, wherein at least one of said electrodes is affixed to said substrate as a flat thin lamina.

12. A composite as set forth in claim 11 wherein both electrodes are affixed to said substrate as flat thin laminae and the contraposed portion are edges of said laminae.

13. A composite as set forth in claim 11, wherein said electrically conductive elements are in the form of spaced dots.

14. A composite as set forth in claim 11, wherein said electrically conductive elements are in the form of spaced substantially parallel lines or bars.

15. An overstress responsive composite comprising an electrically insulative substrate, a plurality of electrically conductive pin contact pads affixed to said substrate and each having a hole therethrough coincident with a respective hole in said substrate, said holes being located in a pattern to receive the pins of a connector, each of said pad having an electrode portion, an electrically conductive ground electrode positioned in contraposed relation to each pad electrode portion and affixed to said substrate, each contraposed pair of electrodes defining therebetween a gap extending over a portion of the surface of said substrate, each gap having a pattern of closely spaced electrically conductive elements affixed to said substrate and spanning the gap, and a continuous dielectric overlay also spanning each gap, each of said gaps presenting a high resistance to a low voltage applied across it and a low resistance to a high voltage applied across it.

16. An overstress responsive composite as defined in claim 15, wherein said continuous overlay comprises a resin.

17. An overstress responsive composite as defined in claim 16, applied over the pins of a connector.

18. An overstress responsive composite as defined in claim 16, wherein said resin includes particulates selected from the group consisting of electrically conductive, semiconductive and insulative powders.

19. An overstress responsive composite as defined in claim 15, wherein said pattern of elements is a substantially uniform pattern of dots.

20. An overstress responsive composite as defined in claim 15, wherein said pattern of elements is a set of substantially parallel lines or bars,

* * * * *